US006992011B2

(12) United States Patent
Nemoto et al.

(10) Patent No.: US 6,992,011 B2
(45) Date of Patent: Jan. 31, 2006

(54) METHOD AND APPARATUS FOR REMOVING MATERIAL FROM CHAMBER AND WAFER SURFACES BY HIGH TEMPERATURE HYDROGEN-CONTAINING PLASMA

(75) Inventors: Takenao Nemoto, Kanagawa (JP); Emmanuel Guidotti, Gilbert, AZ (US); Gert Leusink, Hopewell Junction, NY (US)

(73) Assignee: Tokyo Electron Limited, Tokyo (JP)

( * ) Notice: Subject to any disclaimer, the term of this patent is extended or adjusted under 35 U.S.C. 154(b) by 151 days.

(21) Appl. No.: 10/342,645

(22) Filed: Jan. 15, 2003

(65) Prior Publication Data
US 2004/0137750 A1  Jul. 15, 2004

(51) Int. Cl.
*H01L 21/302* (2006.01)
(52) U.S. Cl. ......................... 438/706; 438/714; 134/1.1
(58) Field of Classification Search ................ 438/706, 438/710, 712, 714; 134/1.1, 1.3, 1.2, 2; 216/58, 216/67, 58.67; 156/345.28, 345.48, 345.54
See application file for complete search history.

(56) References Cited

U.S. PATENT DOCUMENTS 5,647,953 A    7/1997  Williams et al. ......... 156/643.1
6,453,915 B1 * 9/2002  Wu et al. ..................... 134/1.2
6,805,139 B1 * 10/2004 Savas et al. .................. 134/1.3

FOREIGN PATENT DOCUMENTS

EP           680 072 A2    11/1995
WO       WO 01/82355 A2    11/2001

OTHER PUBLICATIONS

Ikeda et al., *Electronic Properties of MOS Capacitor Exposed to Inductively Coupled Hydrogen Plasma,* Thin Solid Films, 345 (1999),pp. 172-177.
J.Ramm et al., *Low-temperature in Situ Cleaning of Silico Wafers with an Ultra High Vacuum Compatible Plasma Source.*Thin Solid Films, vol. 222, pp. 126-131, 1992.

(Continued)

Primary Examiner—Lan Vinh
(74) Attorney, Agent, or Firm—Wood, Herron & Evans, LLP

(57) ABSTRACT

A cleaning method is provided using a cleaning gas mixture of hydrogen and inert gas, for example a mixture in which the hydrogen content is between 20 percent and 80 percent by volume, provided to the chamber of a semiconductor wafer processing apparatus and an ICP power source only to generate a high density plasma in the gas mixture without biasing the surface to be cleaned. In examples of the invention, Si and $SiO_2$ contaminants or CFx contaminants are cleaned from a silicon contact prior to subsequent metal deposition. In another example of the invention, silicon residue is cleaned from internal chamber surfaces before oxide etching to recover the baseline oxide etch rate.

23 Claims, 5 Drawing Sheets

OTHER PUBLICATIONS

Zhou et al., *Real-time, in Situ Monitoring of Room-Temperature Silicon Surface Cleaning Using Hydrogen and Ammonia Plasma,* J. Electrochem, Soc., vol. 140, No. 11, pp. 3316-3321, Nov. 1993.

J. Ramm et al., *Hydrogen Cleaning of Silicon Wafters. Investigation of the Wafer Surface After Plasma Treatment.* Thin Solid Films, vol. 228, pp. 23-26, 1993.

B. Anthony et al., *In Situ Cleaning of Silicon Substrate Surfaces by Remote Plasma-Excited Hydrogen,* J. Vac. Sci. Technol. B. vol. 7, No. 4, pp. 621-626, July/Aug 1989.

M. Delfino et al., *Plasma Cleaned Si Analyzed in Situ by X-ray Photoelectron Spectroscopy, Secondary Ion Mass Spectrometry, and Actinometry,* J. Appl. Phys., vol. 71, No. 2, pp. 1001-1009, Jan. 15, 1992.

M. Ishii et al., *Effects of Substrate Temperature and Bias Potential on Hydrogen Plasma Etching of Silicon,* J. Vas. Sci. Technol. B. vol. 12, No. 4, pp. 2342-2345, July/Aug 1994.

\* cited by examiner

METHOD AND APPARATUS FOR REMOVING MATERIAL FROM CHAMBER AND WAFER SURFACES BY HIGH TEMPERATURE HYDROGEN-CONTAINING PLASMA

FIELD OF THE INVENTION

The present invention relates to cleaning of chamber surfaces, contact holes and semiconductor wafer substrates, and, more particularly, to apparatus and processes for cleaning and otherwise preparing contacts and substrates by dry etching in an inductively-coupled hydrogen-containing plasma without biasing the substrate.

BACKGROUND OF THE INVENTION

Silicon contacts form one of the more numerous features on semiconductor devices. The typical configuration of a silicon contact on a semiconductor device is that of a sub-micron width hole or via extending through an insulating layer having a thickness of one micron or more on the device to an exposed area on an electrically conductive underlying layer of silicon that forms the contact. In semiconductor device manufacturing, these silicon contacts are generally first coated with a thin film of metal or metal compound such as titanium (Ti) or titanium nitride (TiN) that forms the metallization layer over which is applied a conductive metal such as tungsten or aluminum, which fills the hole to form a conductor through the insulating layer.

A Ti/TiN film forms an effective bond and conductive interface with the silicon contact on which it is applied and also enhances the formation of the overlying blanket or planarization layer that will fill the hole. Where the planarization layer is tungsten, the process currently used for its application is that of CVD with a $WF_6$ reduction by which the tungsten nucleates onto the TiN layer, filling the holes and vias, often by planarizing the surface with a blanket tungsten film. In such a semiconductor manufacturing process, the resistivity of the junction between the Ti/TiN film and the silicon contact at the bottom of the hole or via must be kept low. Oxides and other impurities on the surface of the silicon contact increase the resistivity of the contact, and therefore should be cleaned from the silicon surface at the bottom of the hole, particularly where the size of the contact is small.

Research has focused attention on methods of cleaning silicon contacts in these high aspect ratio semiconductor devices. Wet chemical techniques such as the multi-step processes and hydrofluoric (HF) acid dip processes are used as the current industry standard, but when the holes have dimensions of one-quarter micron or less, these wet cleaning methods often contribute particles that can contaminate the wafer as well as being less than fully effective in cleaning the contact surfaces at the bottoms of these deep narrow holes and vias.

In-situ methods of cleaning silicon contacts, that is dry cleaning methods where wafers containing the devices are cleaned in place in the processing machine in which the metallization is to occur, just prior to metal deposition, have been of extreme interest in that they can provide a particle free environment and reduce native oxide formation on the silicon contacts during transfer through atmosphere and into the deposition module. In-situ approaches of the prior art have, however, not been effective. One in-situ method of cleaning the surfaces at both the contact and via level has included a physical etching process using an inert gas such as argon (Ar) in a plasma. Such plasmas are typically created by oppositely biasing electrodes to move electrons through the gas, stripping gas atoms of their electrons to create a plasma of positive Ar ions. One of the electrodes is typically a cathode assembly on which the surface to be cleaned is mounted. The positive Ar ions that are created in the plasma are accelerated to the surface of the wafer by a negative bias applied to the wafer surface, where the ions strike the surface and thereby dislodge material from the wafer surface by momentum transfer to remove the material from the wafer. Plasmas are usually confined close to the surface to be plasma etched by the configuration of the chamber walls and other physical structure within the chamber or by magnetic fields that trap the plasma producing electrons over the surface to be etched.

Physical processes such as plasma etching produce bombardment induced damage to the surface of the wafer and to devices being formed on the wafer. In the past, maintaining a low sputtering voltage difference between the substrate and a dense plasma, a process called "soft etch", has been sufficient to minimize some of the potential damage to the surface being etched, but with present devices having features on a sub-micron scale, these soft etch voltages can still impart enough energy to the ions to cause them to inflict damage to some of the devices on the wafers. One such soft etch process uses a plasma cleaning method in which the plasma is powered independent of the accelerating bias voltage, which provides separate control of the bias voltage to allow lower sputtering energy to be used while still maintaining a plasma that is adequately dense for the process to proceed efficiently where the features are not too small. Nonetheless, such low energy sputter cleaning processes still have several drawbacks for very high aspect ratio devices currently being manufactured. Physical processes such as sputtering can redeposit materials from sidewalls of such high aspect ratio holes and vias onto the contact areas at the bottoms. Further, sputtering yields on the contacts at the bottoms of the deep holes and vias are low, which makes the cleaning process inadequate or at least very slow.

The need to clean a semiconductor wafer surface while inflicting minimal damage from the energy of the sputtering ions has been approached with the use of high density low energy plasmas such as those produced by electron cyclotron resonance (ECR). ECR plasma sources, however, include microwave generators and other complex components that are expensive and occupy substantial space either at the cleaning site or at a somewhat remote location near the cleaning site. These ECR generators produce a high density plasma that is caused to flow downstream and against the surface of the wafer to be cleaned. Such plasmas are capable of contacting the surface of the wafer biased at a low voltage so that ions strike the wafer surface with energy sufficiently low to reduce surface damage. However, low sputtering yield and therefore difficulty in effectively cleaning contacts at the bottoms of vias has remained a deficiency of purely physical etching processes.

The low sputtering yield in particular has led to investigation of adding a diffusive, chemical component to the etch, such as a component of hydrogen radicals to provide a hydrogen-based silicon contact dry cleaning process. Hydrogen based cleaning using ECR plasma sources has demonstrated successful cleaning of silicon contacts using an $Ar/H_2$ plasma prior to CVD-Ti deposition. But remotely located ECR sources suffer nonetheless from large size and complex and expensive equipment as discussed above.

In all of the above methods for dry cleaning, an RF bias was found necessary for propelling ions to the surface to effect the etching. Even the remote plasma, such as ECR plasma, has been found ineffective for removing oxides and silicon in the absence of an RF bias or significant ion bombardment by self-bias. RF bias generally includes a plasma-to-substrate bias potential of about 100–300 V, whereas self-bias generally occurs at a bias potential of at least 20 V.

In a cleaning process described in J. Ramm et al., "Low-Temperature In Situ Cleaning of Silicon Wafers with an Ultra High Vacuum Compatible Plasma Source" 222 Thin Solid Films 126–131 (1992) and in J. Ramm et al., "Hydrogen Cleaning of Silicon Wafers: Investigation of the Wafer Surface After Plasma Treatment" 228 Thin Solid Films 23–26 (1993), a hydrogen/argon gas discharge is established by applying a potential between a grounded substrate holder and a DC filament. The discharge is characterized by voltages of 20–35 V, such as 30 V, and high currents up to 100 A, such as 10–100 A. A significant part of the DC current flows through the Si substrate to the grounded substrate holder. This high electron current and associated ion bombardment heat up the substrate to about 200–400° C. The described cleaning process is applied to Si wafer preparation for subsequent epitaxial deposition processing. Thus, the application is specific to bare silicon wafers and does not address cleaning inside deep, high aspect ratio features. Consequently, the described process is not required to prevent charge-up damage as in the case of cleaning of contacts, where high current densities through the wafer result in damage to the semiconductor device.

Accordingly, there remains a need for a dry cleaning method and an apparatus for effectively cleaning high aspect ratio contacts, without damage to the devices, that provide benefits at least as good as those of an ECR source, but with much simpler equipment.

In addition, during the manufacture of silicon contacts, a layer of polycrystalline silicon, referred to as poly-Si, is grown on the substrate, and then a portion of the poly-Si is etched away by argon sputter etching. During this poly-Si etching step, silicon is deposited on interior surfaces of the etching chamber. This silicon residue creates a memory effect in which, during subsequent oxide etching of wafers in the same chamber, the etch rate of the oxide changes after a poly-Si etch. Several sacrificial wafers are first required to recover the etch rate of the oxide to a normal level. Processing sacrificial wafers to recover a process is a costly and impractical procedure. Therefore, an in-situ chamber cleaning method is needed to recover the baseline oxide etch process after a poly-Si etch process has been carried out in the same chamber.

SUMMARY OF THE INVENTION

The present invention provides a method and apparatus for cleaning contacts in high aspect ratio features of semiconductor wafers and the wafer surface without damage to the devices which the wafers contain.

The present invention further provides an apparatus for cleaning the contacts and substrate surfaces that is neither complex nor expensive, yet provides for effective cleaning of the contacts and substrate surfaces without damage to the devices on such wafers.

The present invention also provides a method and apparatus for cleaning internal chamber surfaces to remove residual silicon deposits, thereby decreasing or eliminating changes in subsequent wafer cleaning rates.

To this end, there is provided a method of cleaning high aspect ratio contacts, substrate surfaces, and internal chamber surfaces wherein an inductively-coupled plasma is formed from a $H_2$ and inert gas mixture, proximate an unbiased, non-grounded wafer or chamber surface held at a temperature from about sub-room temperature up to about 500° C., for example about room temperature up to 200° C., wherein the plasma is maintained to have a plasma-to-surface bias potential at a level that is below the voltage at which self-biasing would develop under the same or similar process conditions.

DETAILED DESCRIPTION OF THE DRAWINGS

Figure 1:
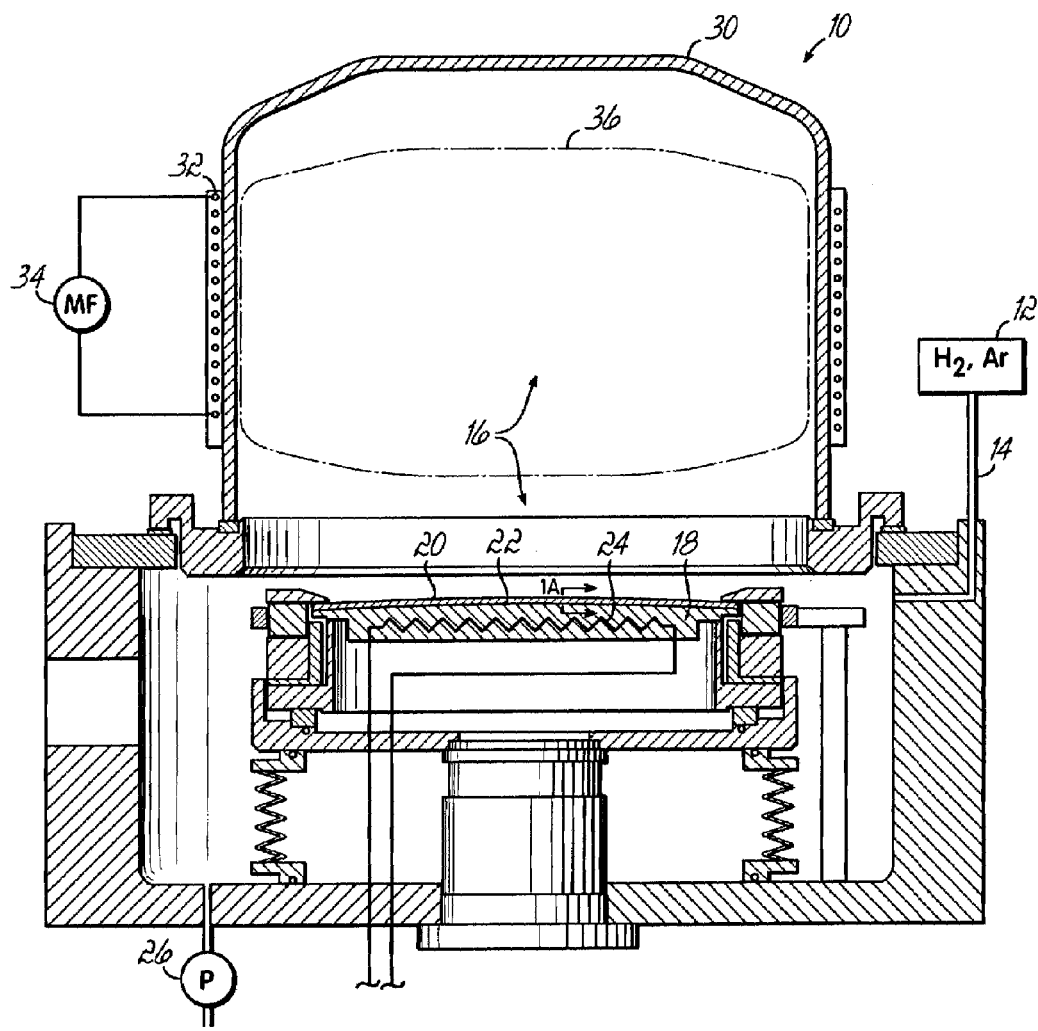
FIG. 1 is a cross-sectional view of a CVD apparatus that includes high aspect ratio contact cleaning features according to an embodiment of the present invention.

FIG. 1 illustrates a CVD apparatus 10 which may be used for cleaning wafer and chamber surfaces in the fabrication of semiconductor devices. The exemplary apparatus 10 includes a gas supply 12 and inlet line 14 for supplying the hydrogen ($H_2$) and inert gas mixture, for example an $H_2$ and argon (Ar) gas mixture, to a high density plasma discharge chamber 16 having a wafer support or susceptor 18 for supporting a wafer 20. The susceptor 18 has an upwardly facing circular wafer supporting surface 22 thereon and includes a heater/cooler 24 for raising the temperature of a wafer on the surface 22 to a temperature above room temperature, up to about 500° C., if desired, or for lowering the temperature to a sub-room temperature. The apparatus 10 also includes a turbo molecular pump 26 for producing a flow rate of hydrogen in the range of about 1 to 20 sccm at pressures over a range that at least includes from 0.1 to 10 Torr.

A quartz belljar forms the upper wall 30 of the chamber 16 around the circumference thereof and an ICP power source is coupled to the chamber 16, for example, a helical ICP-type coil 32 is provided around the belljar 30 outside the chamber 16 of the apparatus 10 to which is connected a RF source 34 for applying MF or HF energy, for example, at 450 kHz, 2 MHz or 13.56 MHz, to produce a high-density plasma in region 36 adjacent the wafer 20. The ICP power may be in the range of about 500 to about 1000 W, for example about 1000 W for a 200 mm surface, for example. For a larger surface, a higher ICP power may be used. For example, for a 300 mm surface, an ICP power in the range of 1125–2250 W is effective. The use of a quartz belljar minimizes the presence of conductive surfaces bounding the plasma region 36, thereby minimizing surfaces that could draw electrons out of the plasma, such that the plasma remains neutral.

Susceptor 18 is an unbiased, non-grounded wafer holder. For example, the susceptor 18 is an electrically insulated wafer holder, such as an electro-static chuck. The electrically insulated wafer holder 18 not only prevents device-damaging DC currents from going through the wafer, but also aids in reducing the energy of ions arriving at the wafer surface to values well below sputter thresholds. The reduction of energy may be, for example, from 20 eV down to about 15 eV. Susceptor 18 is allowed to float, for example, at a potential of about 5–10 eV. Thus, the bias potential gradient is generally in the range of about 10–15 eV.

Figure 1A:
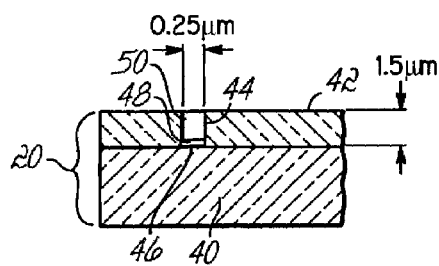
FIG. 1A is an enlarged cross-sectional view taken along line 1A of FIG. 1 depicting a wafer having a high aspect ratio via.

The apparatus 10, equipped as described above, operates to perform the process of the present invention by effectively cleaning high aspect ratio contacts on semiconductor wafers, such as the wafer 20, a closeup of which is illustrated in FIG. 1A. In FIG. 1A, wafer 20 includes a base or substrate layer 40 of silicon (Si) over which has been deposited a generally insulating layer, such as, for example, layer 42 of silicon dioxide ($SiO_2$) having a thickness of, for example, about 1.5 $\mu$m. Through the insulating $SiO_2$ layer 42 has been formed, by etching or some other process, a number of holes 44 or vias that pass through the layer 42 to expose the conductive silicon layer 40 underneath. The exposed area at the bottom of the hole 44 constitutes a contact 46 to which must be connected an electrical conductor by a process referred to as "metallization". In a metallization process, a thin layer 48 of Ti or TiN is typically deposited onto the contacts 46 over which a blanket layer 50 of a conductive metal such as tungsten is deposited to fill the holes 44 to form a contact that extends through the $SiO_2$ layer 42. The Ti and TiN layers enhance the bond and electrical conductivity between the tungsten and the silicon layer 40.

The process of forming the $SiO_2$ layer 42 and pattern of holes 44 is typically carried out in one or more processing machines from which they are transported through an oxygen containing environment to a CVD apparatus for further processing. During this transportation of the partially processed wafers 20, oxides tend to form on the contacts 46, which can inhibit the effective deposition of Ti or TiN onto the Si of the contact 46 and can increase the resistivity at the contact. By the process of the present invention, the contact 46 is cleaned by a $H_2$/inert gas ICP-only plasma before deposition of the Ti or TiN layer by CVD. Unlike the low-density plasmas used in prior processes, the ICP power source forms a high-density plasma in the gas mixture, which is effective to clean the contact without the need for biasing the substrate, either by means of an imposed RF bias or by significant self-biasing.

According to an embodiment of the process of the present invention, a wafer 20 having a substrate base layer 40 of Si thereon and covered with an insulating layer 42, such as an $SiO_2$, overlying the Si layer 40 with a pattern of holes 44 therethrough, is placed on susceptor 18 in the chamber 16 of the apparatus 10. The chamber 16 is then purged by flushing it with an inert gas, such as Ar gas or helium (He) gas, and by pumping the chamber 16 to a vacuum of about $10^{-4}$ Torr. When the chamber 16 is purged of unwanted gas, a mixture of $H_2$ and inert gases, from the source 12, is entered into the chamber 16. The flow rate may be in the range of about 1–20 sccm, for example about 3–12 sccm of $H_2$, with the $H_2$ being between 20 and 80 percent of the mixture, the balance inert gas, such as Ar or He. The heater 24 is energized to raise the temperature of the wafer 20 up to about 500° C., if desired, or the wafer 20 may be maintained at room temperature or lowered to sub-room temperature, if desired.

When the flow of the $H_2$ and inert gas mixture has been established, the generator 34 is activated to energize an ICP-only plasma in the gas mixture adjacent the wafer 20 supported on the top surface 22 of the susceptor 18. The content of $H_2$ in the gas mixture is advantageously in the range of 40–80% provided that the plasma in the mixture will ignite. The energy from the generator 34 is typically at 450 kHz in the MF band, though other frequencies maybe used, such as 2 MHz or 13.56 MHz. The susceptor 18 does not need to be rotated during this cleaning process. The conditions of the process are maintained for approximately 60 seconds. The wafer 20 is not biased, and not grounded. During the process, a hydrogen-rich, dense plasma is discharged solely by the ICP coil, which generates hydrogen radicals and inert gas ions that chemically etch the Si and $SiO_2$ in the absence of an RF or significant self-bias to the wafer 20. The process of the present invention results in low damage toward the wafer 20.

The method of the present invention relies on hydrogen radicals and inert gas ions, which are generated by the dense $H_2$/Ar plasma or $H_2$/He plasma, for chemically etching Si and $SiO_2$ according to the following formulas:

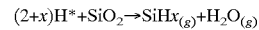

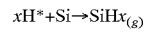

wherein x may have any value. The floating wafer holder or susceptor 18 and the ICP-only plasma creates a low plasma potential and a low bias potential. The plasma potential is less than the potential for hydrogen ionization to occur. Thus, the plasma contains free hydrogen radicals that effectively aid in cleaning of contact surfaces without the device-damaging bombardment that may occur with hydrogen ions. The plasma formed is substantially electrically neutral, and the floating potential of the wafer maintains the surface-to-wafer bias potential at a low value. Consequently, ion bombardment is reduced or eliminated.

Carbon fluoride (CFx) contaminated silicon wafers may also be exposed to an ICP plasma without biasing the substrate to obtain effective cleaning of the wafer. The CFx contaminated silicon wafers are generally prepared by dry etching a resist-coating, typically a polymer material, on an Si substrate by a CF chemical. CFx contaminants remain on the Si surface, particularly in the corners of the contact 46. By the ICP plasma process of the present invention, CFx contamination may be removed according to the following formula:

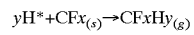

wherein x and y may have any value. Thus, the cleaning process of the present invention may be used to remove CFx contamination generated by conventional etching processes in ULSI fabrication. Similarly, other organic contaminants may be removed.

The cleaning process may also be applied as a copper metallization process or other metallizations such as silver and gold. Copper oxide (silver oxide or gold oxide) may be removed without sputtering the copper metal according to the following formula:

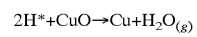

For some metals such as copper, silver and gold, argon atoms may sputter and thus damage the metal during oxide removal. Therefore, helium gas is advantageously used for the inert gas in the plasma gas mixture because helium atoms do not have a tendency to sputter the metal. Similarly, the cleaning method of the present invention may be applied to other metallization cleaning processes according, for example, to the following examples:

$$TiO_x+2H^* \rightarrow Ti+H_2O_{(g)}$$

$$CoO_x+2H^* \rightarrow Co+H_2O_{(g)}$$

$$TaO_x+2H^* \rightarrow Ta+H_2O_{(g)}$$

$$WO_x+2H^* \rightarrow W+H_2O_{(g)}$$

$$NiO_x+2H^* \rightarrow Ni+H_2O_{(g)}$$

wherein x may have any value. These metals are not appreciably sputtered by argon atoms, and thus, either argon or helium may be used in the plasma gas mixture.

In addition to cleaning of wafer surfaces, the $H_2$/Ar ICP-plasma may be used to remove material from internal surfaces of the semiconductor plasma processing equipment, such as internal surfaces of belljar 30 and surfaces of susceptor 18, particularly for equipment in which the chamber is used for more than one wafer manufacturing process. The plasma cleaning process of the present invention is used to recover wafer processing results that are effected by material being deposited on the internal surfaces during a previous wafer manufacturing process. The ICP-plasma is used to condition the chamber after argon sputter etching silicon wafers during which silicon deposits on internal chamber surfaces. Conditioning with the $H_2$/Ar ICP-plasma can erase the memory effect for an ICP-plasma apparatus. The $H_2$/Ar plasma reacts with Si residue on internal chamber surfaces to generate $SiH_x$ gas, which is then removed from the chamber. For example, when 150 Å of poly-Si is etched, a 200 second conditioning of the chamber with a 60% $H_2$ and 40% Ar ICP-plasma with 1000 W ICP power is sufficient to accomplish the same oxide etch rate in the chamber after poly-Si etching as before poly-Si etching. In the absence of the conditioning treatment of the present invention, about 5 sacrificial wafers would need to be subjected to oxide etching in the chamber before the etch rate is recovered to a normal level.

Figure 2:
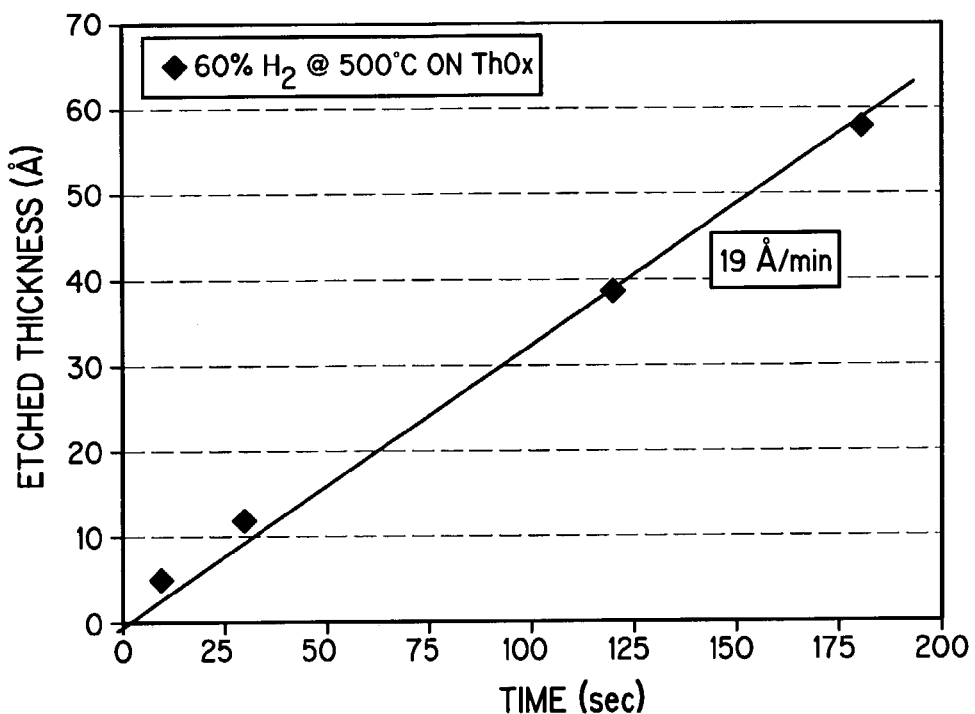
FIG. 2 is a plot of time versus the amount etched for a process of the present invention.
Figure 3:
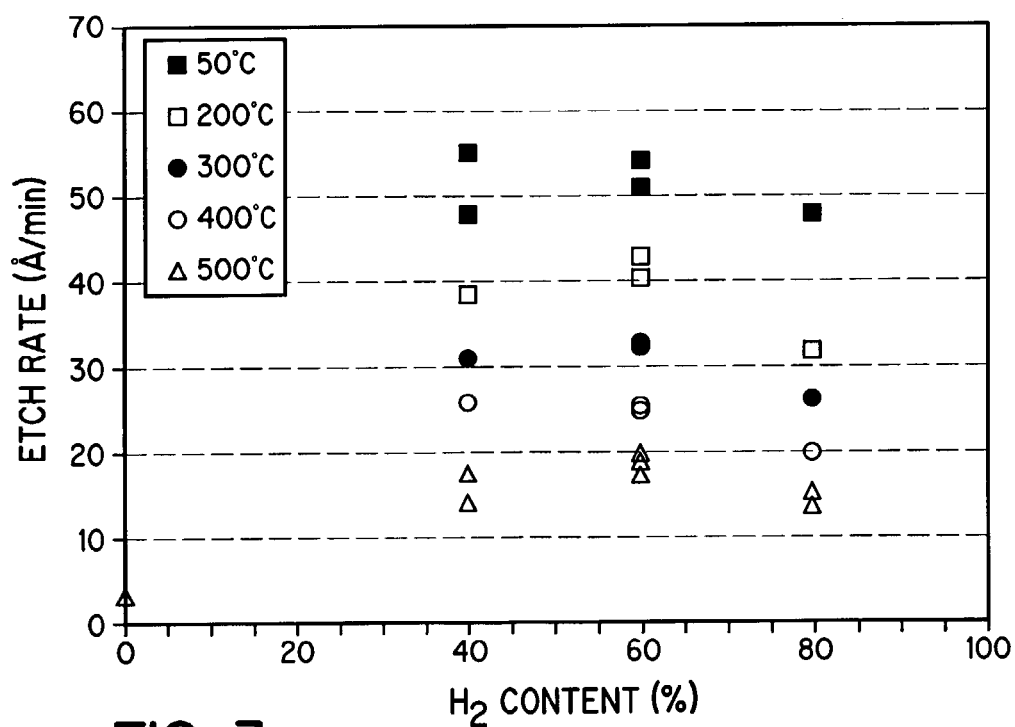
FIG. 3 is a plot of hydrogen concentration versus etch rate for a process of the present invention.
Figure 4:
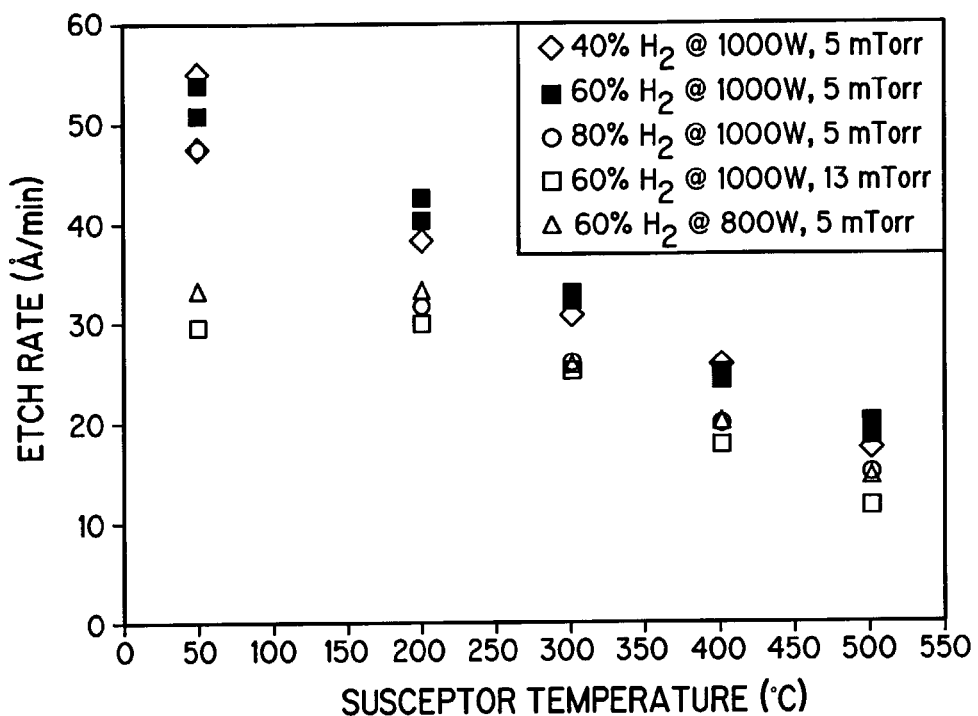
FIG. 4 is plot of susceptor temperature vs. etch rate for a process of the present invention.

FIGS. 2–5 provide examples of the $SiO_2$ etching process for cleaning contacts. In FIG. 2, tests were conducted using 1000 W ICP power, 5 mtorr chamber pressure, 12 sccm and 8 sccm of $H_2$ and Ar flow, respectively, and a susceptor temperature of 500° C. A plot of the amount etched as a function of time shows that the etch rate is constant during the etch process, and that there is no incubation time. Using the same power, pressure and flow rate parameters as in FIG. 2, and a treatment time of 60 sec., FIG. 3 plots the amount etched as a function of $H_2$ concentration at various temperatures. The etch rate appears to be weakly dependent on $H_2$ concentration, with a maximum etch rate occurring at about 60% $H_2$ and 40% Ar. He gas could be used in place of Ar gas. As a reference, an etch rate of only 3 Å/min. was obtained in the absence of $H_2$. This small etch amount is ascribed to a very small amount of $SiO_2$ removal by Ar ions that are accelerated through the plasma sheath between the wafer surface and the bulk plasma. At any given $H_2$ concentration, higher etch rates were observed at lower susceptor temperatures. The susceptor temperature dependence of the etch rate, which is plotted in FIG. 4 using varying ICP power, chamber pressure and $H_2$ concentration, demonstrates that higher etch rates are obtained at lower temperatures. FIG. 4 further depicts that the etch rate decreases with decreasing ICP power and with increasing pressure.

Based on the above oxide etch results depicted in FIGS. 2–4, another experiment was designed to evaluate the ICP-only plasma process for contact cleaning, i.e., $SiO_2$ and Si removal from the bottom of contact holes in actual devices. For this test, devices with contact openings of 0.45 μm and 0.4 μm were used with an interlayer oxide thickness of 0.3 μm. For all tests, an equivalent of 50 Å of $SiO_2$ was removed and the cleaning process was followed by deposition of 70 Å PECVD-Ti/200 Å CVD-TiN. The following variations in test conditions were employed:

Room temperature, ICP-only

300° C., ICP-only

500° C., ICP-only.

For comparison, the same test was run in accordance with the prior art using an RF bias, and by cleaning with HF, as follows:

500° C., 200 watt RF bias

HF dip, 30 seconds (reference).

Figure 5A:
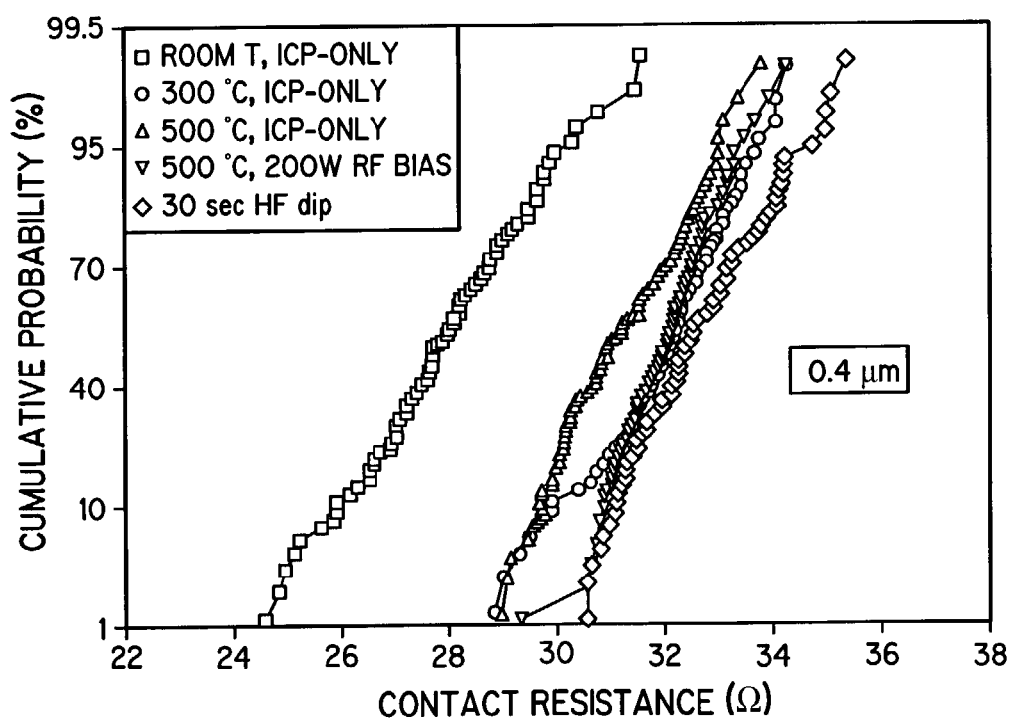
FIGS. 5A and 5B are plots of contact resistance versus cumulative probability for various cleaning methods of the present invention and prior art for cleaning 0.4 $\mu$m and 0.45 $\mu$m vias, respectively.
Figure 5B:
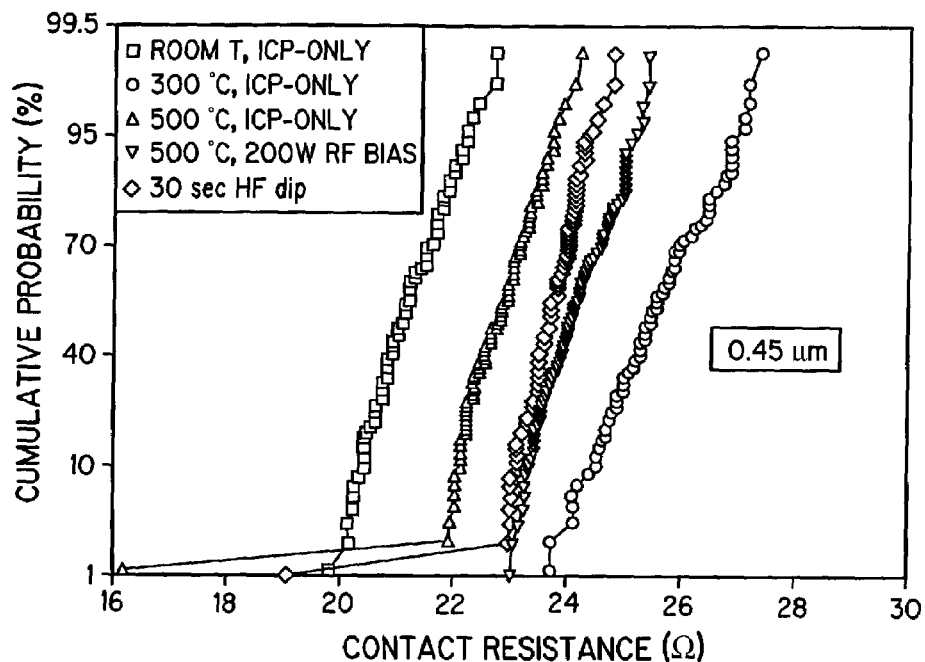

FIGS. 5A and 5B show the contact resistance obtained with the various contact-cleaning processes, with FIG. 5A depicting the results with the 0.4 μm via and FIG. 5B depicting the results with the 0.45 μm via. Surprisingly, the lowest resistance is obtained for the ICP-only process at room temperature. The results obtained with the ICP-only conditions at room temperature are significantly better than the results obtained using the $H_2$/Ar etch with an RF bias at 500° C. and the reference process using the HF dip.

The extendability of the $H_2$/Ar ICP-only plasma cleaning process to other wafer surface and contact contaminants, particularly carbon-based contaminants, is demonstrated for CFx removal from Si wafers. As discussed above, CFx contamination occurs during dry etching of resist coatings using a CF chemical. Table 1 provides the $H_2$/Ar ICP-only etch data for CFx polymer removal from Si surfaces for temperatures ranging from 30° C. to 500° C. All but about a mono-layer of carbon is removed from the Si surface. The carbon is believed to be removed in the form of volatile $CH_xF_y$. Although fluorine levels were below the detection limit before the process, it is believed that F is removed in the form of HF and/or $CH_xF_y$.

TABLE 1

Carbon and Fluorine Densities Before and After $H_2$/Ar ICP-only Process

| | Process Parameters | | | | | Contamination | |
|---|---|---|---|---|---|---|---|
| Sample | Temperature (° C.) | Pressure (mT) | Bias (Watts/Volts) | ICP Power (Watts) | Time (seconds) | C* (atoms/cm$^2$) | F** (atoms/cm$^2$) |
| CFx Monitor | | | | | | 27 × 10$^{16}$ | 8 × 10$^{15}$ |
| Clean Si | | | | | | 20 × 10$^{15}$ | no F detected |

TABLE 1-continued

Carbon and Fluorine Densities Before and After H$_2$/Ar ICP-only Process

| | Process Parameters | | | | | Contamination | |
|---|---|---|---|---|---|---|---|
| Sample | Temperature (° C.) | Pressure (mT) | Bias (Watts/Volts) | ICP Power (Watts) | Time (seconds) | C* (atoms/cm$^2$) | F** (atoms/cm$^2$) |
| 1 | 30 | 10 | no bias | 1000 | 5 | $4.0 \times 10^{15}$ | no F detected |
| 2 | 100 | 10 | no bias | 1000 | 5 | $4.5 \times 10^{15}$ | no F detected |
| 3 | 200 | 10 | no bias | 1000 | 5 | $4.0 \times 10^{15}$ | no F detected |
| 4 | 300 | 10 | no bias | 1000 | 5 | $3.0 \times 10^{15}$ | no F detected |
| 5 | 400 | 10 | no bias | 1000 | 5 | $4.0 \times 10^{15}$ | no F detected |
| 6 | 500 | 10 | no bias | 1000 | 5 | $3.5 \times 10^{15}$ | no F detected |

*+/− $0.5 \times 10^{15}$
**Limit on F detections is $1.0 \times 10^{16}$

Figure 6:
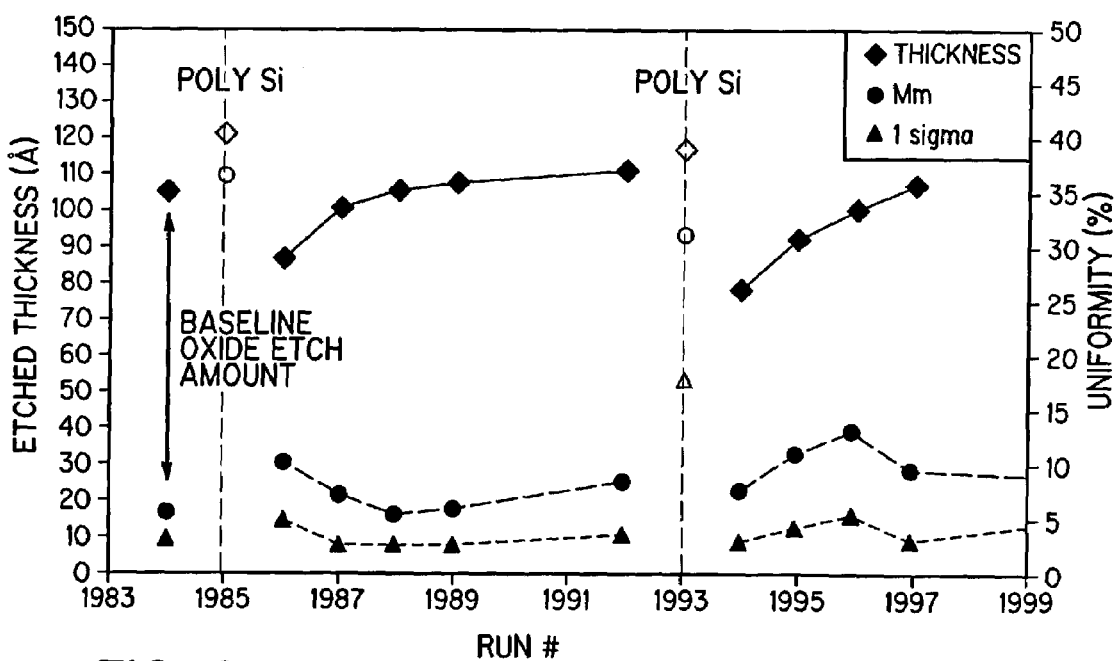
FIG. 6 is a plot depicting the memory effect observed by the oxide etch amount after a poly-Si wafer etch.
Figure 7:
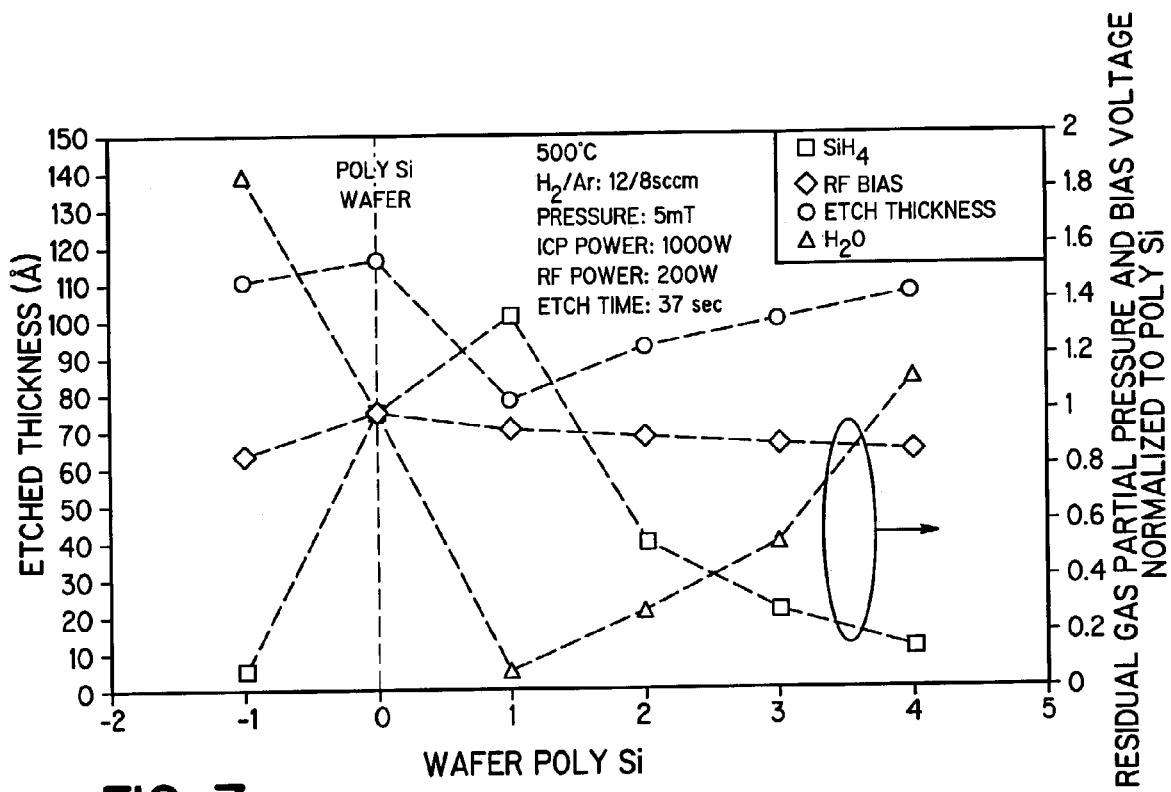
FIG. 7 is a plot depicting the memory effect observed by the oxide etch amount using an RGA and RF bias probe.
Figure 8:
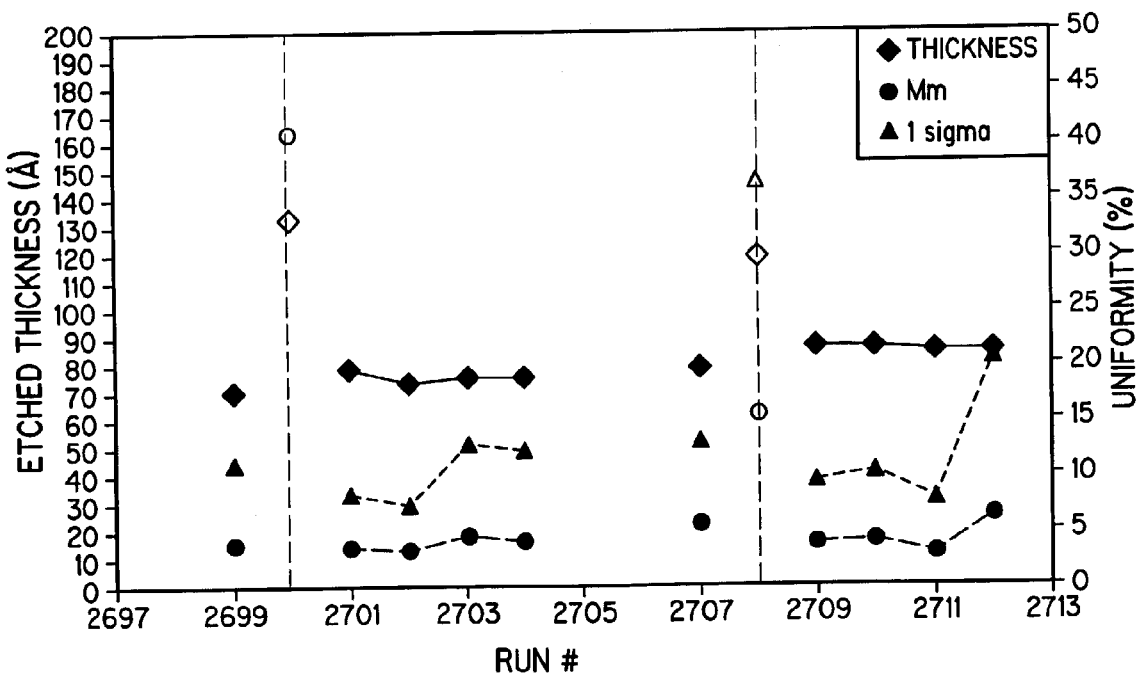
FIG. 8 is a plot depicting the elimination of the memory effect in oxide etch amount after a poly-Si etch by 200 and 400 seconds of ICP-only $H_2$/Ar etch process.

The extendability of the H$_2$/Ar ICP-only plasma cleaning process to applications other than wafer cleaning is demonstrated by Si removal from internal chamber surfaces after Ar sputter etching of silicon wafers. It was found that the removal rate of SiO$_2$ from wafers during a reactive H$_2$/Ar ICP-plasma clean changes after sputter etching Si wafers prior to etching the oxide wafers. This effect, which is a so-called memory effect, goes away after etching typically 5 oxide wafers in a row, as demonstrated in FIG. 6, wherein Mm indicates the difference between the maximum of the distribution curve and the minimum of the distribution curve divided by two times the average value of the distribution curve, and wherein 1 sigma is 1 standard deviation. In-situ residual gas (RGA) measurements in FIG. 7 demonstrate that the recovery of the oxide etch removal rate coincides with the removal of Si from internal (quartz) chamber surfaces (SiH$_2$ mass decreases and H$_2$O mass increases). Specifically, the signal of residue gas analysis shows that SiH$_2$ and SiH$_4$ signals decrease during the H$_2$/Ar plasma as Si is removed from the chamber surfaces. Processing sacrificial wafers to recover a process is costly and impractical. Thus, an in-situ chamber cleaning step of the present invention using the H$_2$/Ar ICP-only plasma can be used to recover the baseline oxide etch process after the Si etch process. In FIG. 8, it is depicted that the oxide etch can be fully recovered after an H$_2$/Ar ICP-only treatment of the internal chamber surfaces. During this treatment, the Si is efficiently removed from the surface under formation of SiHx, which, unlike fluorinated compounds, is an environmentally friendly chemical that can readily react with air under formation of H$_2$O (water) and SiO$_2$ (sand). Chamber cleaning traditionally involves halogenated gases that remove the contamination under formation of volatile species. Thus, the use of the cleaning process of the present invention allows for chamber cleaning without volatile species formation or the use of sacrificial wafers.

From the description of the embodiments of the process and apparatus of the present invention set forth above, it will be apparent to one of ordinary skill in the art that variations and additions to the embodiments disclosed can be made without departing from the present invention.

What is claimed is:

1. A method for cleaning a surface in a semiconductor wafer processing chamber without imposing a RF bias to the wafer, the method comprising:
   placing a semiconductor wafer having a feature thereon onto a non-grounded susceptor surface in the chamber, the feature having a contaminant thereon, and the feature being at least one of a silicon contact or a metallization,
   providing a gas mixture comprising H$_2$ and an inert gas to the chamber;
   forming an inductively-coupled plasma in the gas mixture by energizing an ICP power source coupled to the chamber and maintaining a plasma-to-wafer bias potential at a level of 15 eV or less; and
   maintaining the plasma for a time sufficient to remove the contaminant from the feature, the method further comprising, prior to placing the semiconductor water having the feature thereon in the process chamber;
   etching a polysilicon layer on at least one semiconductor wafer in the chamber wherein a silicon residue contaminant is deposited on internal surfaces of the chamber, and thereafter removing the at least one wafer from the chamber;
   providing a gas mixture comprising H$_2$ and an inert gas to the chamber;
   forming an inductively-coupled plasma in the gas mixture by energizing an ICP power source coupled to the chamber and maintaining a plasma-to-surface bias potential at a level of 15 eV or less; and
   maintaining the plasma for a time sufficient to remove the silicon residue contaminant from the internal surfaces.

2. The method of claim 1 wherein the feature is a silicon contact in a SiO$_2$ layer, and the contaminant is an oxide contaminant, and wherein maintaining the plasma is for a time sufficient to remove the oxide contaminant from the silicon contact.

3. The method of claim 1 wherein the feature is a silicon contact in a SiO$_2$ layer, and the contaminant is a CFx contaminant, and wherein maintaining the plasma is for a time sufficient to remove the CFx contaminant from the silicon contact.

4. The method of claim 1 wherein the inert gas is argon or helium.

5. The method of claim 1 wherein the gas mixture comprises about 20% to about 80% H$_2$.

6. The method of claim 1 wherein the ICP power source is energized to provide the plasma-to-wafer bias potential between about 10–15 eV.

7. The method of claim 1 wherein the susceptor surface is electrically insulated and further comprising floating the wafer at a potential in the range of about 5–10 eV.

8. The method of claim 1 wherein the ICP power source is energized to form the plasma consisting essentially of inert gas ions and hydrogen radicals.

9. The method of claim 1 wherein the feature is a metallization and the contaminant is an oxide contaminant, and wherein maintaining the plasma is for a time sufficient to remove the oxide contaminant from the metallization.

10. The method of claim 9 wherein the metallization is selected from the group consisting of copper, silver and gold, and wherein the inert gas is helium.

11. The method of claim 9 wherein the metallization is selected from the group consisting of Ti, Co, Ta, W and Ni, and wherein the inert gas is argon or helium.

12. The method of claim 1 wherein the feature is a metallization and the contaminant is an organic contaminant, and wherein maintaining the plasma is for a time sufficient to remove the organic contaminant from the metallization.

13. The method of claim 12 wherein the metallization is selected from the group consisting of copper, silver and gold, and wherein the inert gas is helium.

14. The method of claim 12 wherein the metallization is selected from the group consisting of Ti, Co, Ta, W and Ni, and wherein the inert gas is argon or helium.

15. A method the cleaning internal chamber surfaces and silicon wafer contact surfaces in a semiconductor wafer processing chamber without imposing a RF bias to the surfaces and wafer, the method comprising:
  etching a polysilicon layer on at least one first semiconductor wafer in the chamber whereby a silicon residue contaminant is deposited on internal surfaces of the chamber, and thereafter removing the at least one first semiconductor wafer from the chamber;
  providing a gas mixture comprising $H_2$ and an inert gas to the chamber;
  forming a first inductively-coupled plasma in the gas mixture by energizing an ICP power source coupled to the chamber and maintaining a first plasma-to-surface bias potential at a level of 15 eV or less;
  maintaining the first plasma for a time sufficient to remove the silicon residue contaminant from the internal surfaces;
  placing at least one second semiconductor wafer having silicon contact surfaces thereon on a non-grounded susceptor surface in the chamber, the silicon contact surfaces on the wafer having a contaminant thereon;
  providing the gas mixture comprising $H_2$ and the inert gas to the chamber;
  forming a second inductively-coupled plasma in the gas mixture by energizing the ICP power source coupled to the chamber and maintaining a second plasma-to-surface bias potential at a level of 15 eV or less; and
  maintaining the second plasma for a time sufficient to remove the contaminants from the silicon contacts.

16. The method of claim 15 wherein the inert gas is argon or helium.

17. The method of claim 15 wherein the gas mixture comprises about 20% to about 80% $H_2$.

18. The method of claim 15 wherein the ICP power source is energized to provide the first and second plasma-to-surface bias potentials between about 10–15 eV.

19. The method of claim 15 wherein the wafer is placed on an electrically insulated susceptor surface the chamber, and further comprising floating the wafer at a potential in the range of about 5–10 eV.

20. The method of claim 15 wherein the ICP power source is energized to form the plasma consisting essentially of inert gas ions and hydrogen radicals.

21. The method of claim 15 further comprising heating the susceptor surface to a temperature above room temperature up to about 500° C.

22. The method of claim 15 further comprising cooling the susceptor surface to a temperature below room temperature.

23. The method of claim 15 further comprising maintaining the susceptor surface at room temperature.

* * * * *

UNITED STATES PATENT AND TRADEMARK OFFICE
CERTIFICATE OF CORRECTION

PATENT NO. : 6,992,011 B2
APPLICATION NO. : 10/342645
DATED : January 31, 2006
INVENTOR(S) : Nemoto et al.

It is certified that error appears in the above-identified patent and that said Letters Patent is hereby corrected as shown below:

Title page item (56), under other publications Col. 2, lines 4 & 5,
"Silico Wafers" should read --Silicon Wafers--.
Page 2, Col. 1, line 5, "Electrochem, Soc.," should read --Electrochem. Soc.,--.
Page 2, Col. 1, line 7, "Silicon Wafters" should read --Silicon Wafers--.
Col. 4, line 23, "is plot of" should read --is a plot of--.
Col. 6, line 11, "maybe" should read --may be--.
Col. 7, line 47, "5 mtorr" should read --5 mTorr--.
Col. 10, line 20, "metallization," should read --metallization;--.
Col. 10, line 29, "water" should read --wafer--.
Col. 11, line 22, "method the cleaning" should read --method for cleaning--.
Col. 12, line 23, "surface the chamber" should read --surface in the chamber--.

Signed and Sealed this

Eighth Day of August, 2006

JON W. DUDAS
*Director of the United States Patent and Trademark Office*